US012615796B2

(12) United States Patent
Fareed et al.

(10) Patent No.: US 12,615,796 B2
(45) Date of Patent: Apr. 28, 2026

(54) ELECTRONIC DEVICE WITH ENHANCEMENT MODE GALLIUM NITRIDE TRANSISTOR, AND METHOD OF MAKING SAME

(71) Applicant: Texas Instruments Incorporated, Dallas, TX (US)

(72) Inventors: Qhalid RS Fareed, Plano, TX (US); Dong Seup Lee, Mckinney, TX (US); Jungwoo Joh, Allen, TX (US); Chang Soo Suh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/081,301

(22) Filed: Oct. 27, 2020

(65) Prior Publication Data

US 2022/0130988 A1 Apr. 28, 2022

(51) Int. Cl.
H10D 30/47 (2025.01)
H10D 30/01 (2025.01)
H10D 62/85 (2025.01)

(52) U.S. Cl.
CPC ....... H10D 30/4755 (2025.01); H10D 30/015 (2025.01); H10D 62/8503 (2025.01)

(58) Field of Classification Search
CPC ........... H01L 29/2003; H01L 29/66462; H01L 29/207; H01L 29/1066; H01L 29/7786;
(Continued)

(56) References Cited

U.S. PATENT DOCUMENTS

| | | | | |
|---|---|---|---|---|
| 7,898,002 B2 * | 3/2011 | Hikita | ................. | H01L 29/1066 |
| | | | | 257/192 |
| 8,076,698 B2 * | 12/2011 | Ueda | ..................... | H01L 29/739 |
| | | | | 257/E29.249 |

(Continued)

FOREIGN PATENT DOCUMENTS

JP 2015115371 A 6/2015

OTHER PUBLICATIONS

PCT International Search Report dated Jan. 20, 2022.
German Office Action for Corresponding Application No. 1120210057324, dated Aug. 20, 2024.

*Primary Examiner* — Natalia A Gondarenko
(74) *Attorney, Agent, or Firm* — Yudong Kim; Frank D. Cimino

(57) ABSTRACT

Fabrication methods, electronic devices and enhancement mode gallium nitride transistors include a gallium nitride interlayer between a hetero-epitaxy structure and a p-doped gallium nitride layer and/or between the p-doped gallium nitride layer and a gate structure to mitigate p-type dopant diffusion, improve current collapse performance, and mitigate positive-bias temperature instability. In certain examples, the interlayer or interlayers is/are fabricated using epitaxial deposition with no p-type dopant source. In certain fabrication process examples, epitaxial deposition or growth is interrupted after the depositing an aluminum gallium nitride layer of the hetero-epitaxy structure, after which growth is resumed to deposit the first gallium nitride interlayer over the aluminum gallium nitride layer to mitigate p-type dopant diffusion and current collapse.

20 Claims, 15 Drawing Sheets

(58) Field of Classification Search
CPC ... H01L 29/66431; H01L 29/778–7789; H01L
29/15–158; H01L 2924/13064; H01L
29/205; H01L 29/42316; H01L 29/452;
H01L 29/7788; H01L 29/0646; H01L
29/6656; H01L 29/6653; H01L 29/66719;
H01L 29/7816; H01L 29/808; H01L
29/786; H01L 29/0615; H01L 29/402;
H01L 29/105; H01L 29/4175; H01L
21/0262; H01L 21/0254; H01L 21/02458;
H10D 30/4755; H10D 30/015; H10D
30/47; H10D 30/473; H10D 30/4732;
H10D 30/475; H10D 62/051; H10D
62/052; H10D 62/8503; H10D 62/824;
H10D 62/852; H10D 62/854; H10D
62/343; H10D 64/20; H10D 64/23; H10D
64/251; H10D 64/254; H10D 64/256;
H10D 64/2565; H10D 64/27; H10D
64/311; H10D 64/517; H10D 64/60;
H10D 64/602; H10D 64/62; H10D 64/64;
H10D 64/649; H10D 30/471; H10D
30/472
USPC .................................... 257/76, 190, 194, 192
See application file for complete search history.

(56) References Cited

U.S. PATENT DOCUMENTS

| | | | | |
|---|---|---|---|---|
| 10,797,168 B1 * | 10/2020 | Moens | .............. | H01L 29/66462 |
| 2007/0278521 A1 * | 12/2007 | Ishida | ................. | H10D 64/602 |
| | | | | 257/E29.253 |
| 2008/0149965 A1 * | 6/2008 | Kaibara | ................ | H01L 29/432 |
| | | | | 257/E29.252 |
| 2008/0210988 A1 | 9/2008 | Tynam | | |
| 2009/0194790 A1 | 8/2009 | Sato et al. | | |
| 2010/0258841 A1 * | 10/2010 | Lidow | .............. | H01L 29/66462 |
| | | | | 257/192 |
| 2013/0146890 A1 * | 6/2013 | Hwang | ............. | H10D 30/4755 |
| | | | | 257/195 |
| 2014/0302673 A1 * | 10/2014 | Kondo | ............. | H01L 21/28575 |
| | | | | 438/666 |
| 2014/0327011 A1 | 11/2014 | Pendharkar et al. | | |
| 2015/0236121 A1 * | 8/2015 | Chiu | ................... | H10D 64/685 |
| | | | | 257/194 |
| 2016/0218202 A1 | 7/2016 | Fareed et al. | | |
| 2016/0293596 A1 | 10/2016 | Fareed et al. | | |
| 2016/0359005 A1 * | 12/2016 | Hu | ....................... | H01L 29/365 |
| 2017/0186859 A1 | 6/2017 | Haider et al. | | |
| 2018/0151712 A1 * | 5/2018 | Ningaraju | .......... | H01L 29/7787 |
| 2018/0166565 A1 * | 6/2018 | Chen | ................... | H10D 30/015 |
| 2018/0323297 A1 | 11/2018 | Suh et al. | | |
| 2019/0181240 A1 | 6/2019 | Fareed et al. | | |
| 2019/0319111 A1 | 10/2019 | Suh et al. | | |
| 2020/0044067 A1 | 2/2020 | Banerjee et al. | | |
| 2020/0185499 A1 | 6/2020 | Lee et al. | | |
| 2020/0185514 A1 * | 6/2020 | Chen | ................... | H01L 29/7786 |
| 2020/0203520 A1 | 6/2020 | Dellas et al. | | |
| 2020/0303535 A1 | 9/2020 | Joh et al. | | |

* cited by examiner

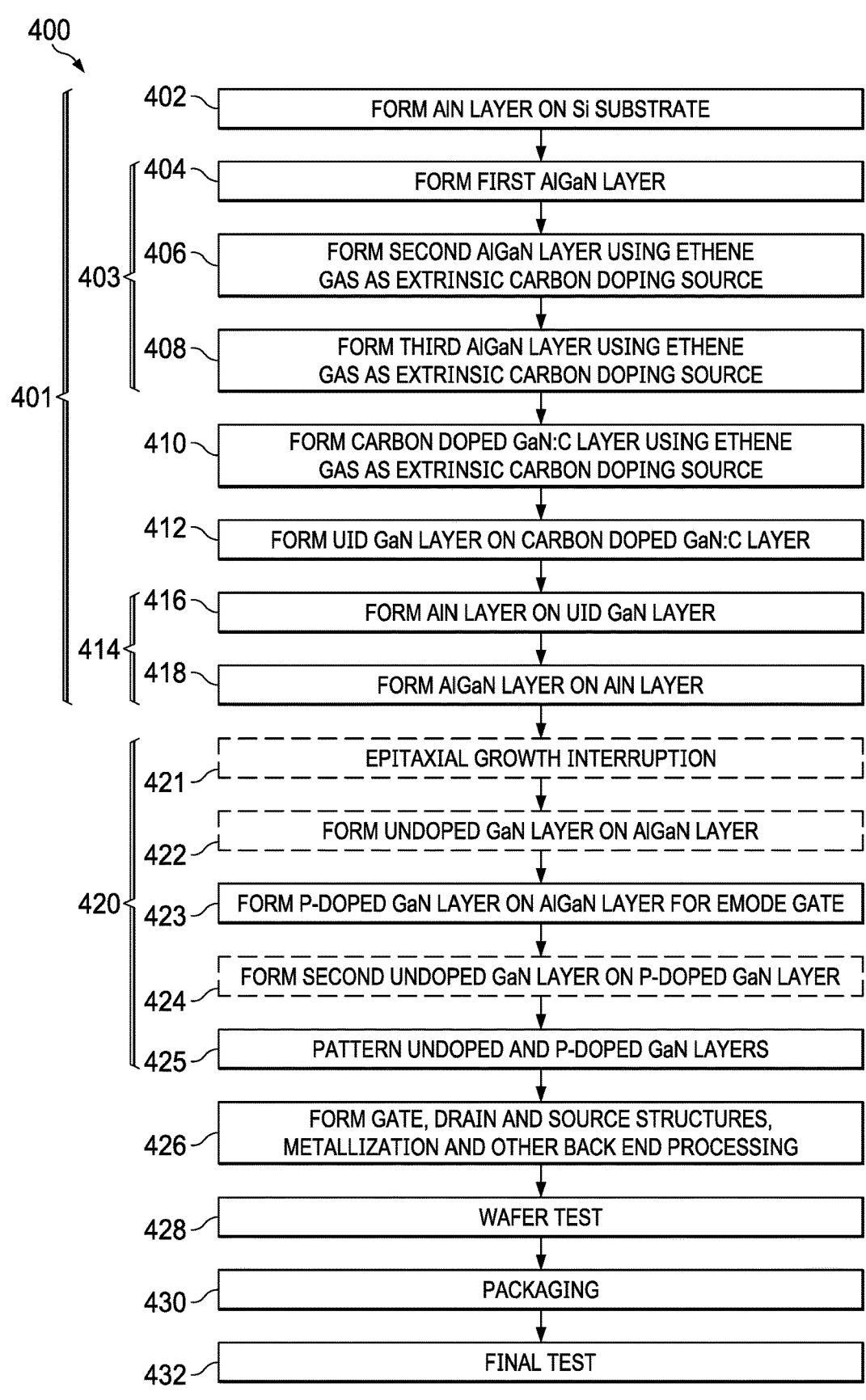

400

401 {

403 {

402 — FORM AlN LAYER ON Si SUBSTRATE

404 — FORM FIRST AlGaN LAYER

406 — FORM SECOND AlGaN LAYER USING ETHENE GAS AS EXTRINSIC CARBON DOPING SOURCE

408 — FORM THIRD AlGaN LAYER USING ETHENE GAS AS EXTRINSIC CARBON DOPING SOURCE

410 — FORM CARBON DOPED GaN:C LAYER USING ETHENE GAS AS EXTRINSIC CARBON DOPING SOURCE

412 — FORM UID GaN LAYER ON CARBON DOPED GaN:C LAYER

414 {

416 — FORM AlN LAYER ON UID GaN LAYER

418 — FORM AlGaN LAYER ON AlN LAYER

420 {

421 — EPITAXIAL GROWTH INTERRUPTION

422 — FORM UNDOPED GaN LAYER ON AlGaN LAYER

423 — FORM P-DOPED GaN LAYER ON AlGaN LAYER FOR EMODE GATE

424 — FORM SECOND UNDOPED GaN LAYER ON P-DOPED GaN LAYER

425 — PATTERN UNDOPED AND P-DOPED GaN LAYERS

426 — FORM GATE, DRAIN AND SOURCE STRUCTURES, METALLIZATION AND OTHER BACK END PROCESSING

428 — WAFER TEST

430 — PACKAGING

432 — FINAL TEST

FIG. 4

ELECTRONIC DEVICE WITH ENHANCEMENT MODE GALLIUM NITRIDE TRANSISTOR, AND METHOD OF MAKING SAME

BACKGROUND

Gallium nitride (GaN) transistors provide certain performance advantages over silicon, including lower on-state resistance (e.g., drain-source resistance or RDSON), lower switching losses, and improved breakdown voltage. Gallium nitride transistors include a hetero epitaxy structure with a junction between materials of different bandgaps, such as aluminum gallium nitride (AlGaN) and gallium nitride, to provide a lateral 2-dimensional electron gas (2DEG) channel formed within the aluminum gallium nitride/gallium nitride hetero epitaxy with high charge density and electron mobility. Depletion mode gallium nitride transistors are normally on, whereas enhancement mode (EMODE) gallium nitride transistors include a gate formed over a positively doped (e.g., p-doped) gallium nitride layer that depletes the 2DEG channel beneath the gate at zero or negative gate bias. Applying a positive gate voltage enhances the 2DEG channel and turns the enhancement mode gallium nitride transistor on to allow current flow between the source and drain. However, magnesium (Mg) or other p-type dopants can diffuse from the p-doped gallium nitride layer into the underlying hetero epitaxy structure during fabrication processing, leading to poor current collapse performance and positive-bias temperature instability (PBTI) that increases the enhancement mode transistor threshold voltage VT as a function of increased pulse width during hard switching. The doping level of the p-doped gallium nitride layer is used to set the nominal threshold voltage, but higher doping levels increase the p-type dopant diffusion. PBTI and offset dependence can be improved with lower doping of the p-doped gallium nitride, but these problems can sharply increase with dopant levels of $1 \times 10^{18}$ atoms per $cm^3$ or more.

SUMMARY

In accordance with one aspect, an electronic device, such as an integrated circuit or packaged transistor product, includes a buffer structure over a substrate, and a hetero-epitaxy structure over the buffer structure. The electronic device includes a gallium nitride interlayer over the hetero-epitaxy structure, as well as a p-doped gallium nitride layer over the gallium nitride interlayer, and an enhancement mode transistor having a gate over the p-doped gallium nitride layer, a drain partially in the hetero-epitaxy structure and spaced apart from the gate, and a source partially in the hetero-epitaxy structure and spaced apart from the gate and from the drain. The p-doped gallium nitride layer has a peak p-type dopant concentration that is more than 10 times greater than a peak p-type dopant concentration of the gallium nitride interlayer. In one example, the gate includes a gate contact over the p-doped gallium nitride layer. Another example includes a second gallium nitride interlayer over the p-doped gallium nitride layer, and the gate includes a gate contact over the second gallium nitride interlayer. The second gallium nitride interlayer in this example has a peak p-type dopant concentration that is less than 0.1 times the peak p-type dopant concentration of the p-doped gallium nitride layer.

In another aspect, an electronic device includes a buffer structure over a substrate, and a hetero-epitaxy structure over the buffer structure. The electronic device includes a p-doped gallium nitride layer over the hetero-epitaxy structure, and a gallium nitride interlayer over the p-doped gallium nitride layer, where the p-doped gallium nitride layer has a peak p-type dopant concentration that is more than 10 times greater than a peak p-type dopant concentration of the gallium nitride interlayer. The electronic device includes an enhancement mode transistor with a gate over the gallium nitride interlayer, a drain partially in the hetero-epitaxy structure and spaced apart from the gate, and a source partially in the hetero-epitaxy structure and spaced apart from the gate and from the drain.

In accordance with a further aspect, a method of fabricating an electronic device includes forming a buffer structure over a substrate and forming a hetero-epitaxy structure over the buffer structure. The method further includes performing a deposition process using no p-type dopants to form a gallium nitride interlayer over the hetero-epitaxy structure, as well as performing a deposition process using p-type dopants to deposit a p-doped gallium nitride layer over the gallium nitride interlayer. The method also includes forming an enhancement mode transistor having a gate over the p-doped gallium nitride layer, a drain partially in the hetero-epitaxy structure and spaced apart from the gate, and a source partially in the hetero-epitaxy structure and spaced apart from the gate and from the drain.

In certain implementations, the method includes forming the gate over the p-doped gallium nitride layer. In one example, the method also includes interrupting epitaxial deposition after an epitaxial deposition process that deposits the aluminum gallium nitride layer of the hetero-epitaxy structure, and after interrupting the epitaxial deposition, performing an epitaxial deposition process using no p-type dopants to form the gallium nitride interlayer over the hetero-epitaxy structure. In this or another example, the method also includes performing a deposition process using no p-type dopants to form a second gallium nitride interlayer over the p-doped gallium nitride layer and forming the gate over the second gallium nitride interlayer.

In another aspect, a method of fabricating an electronic device comprises forming a gate over a p-doped gallium nitride layer. The method also includes forming a hetero-epitaxy structure over a buffer structure, performing a deposition process using p-type dopants that deposits a p-doped gallium nitride layer over the aluminum gallium nitride layer, performing an epitaxial deposition process using no p-type dopants to form a gallium nitride interlayer over the p-doped gallium nitride layer, and forming an enhancement mode transistor having a gate over the gallium nitride interlayer.

BRIEF DESCRIPTION OF THE DRAWINGS

FIG. 4 is a flow diagram of a method for making an electronic device according to a further aspect.

DETAILED DESCRIPTION

Figure 1:
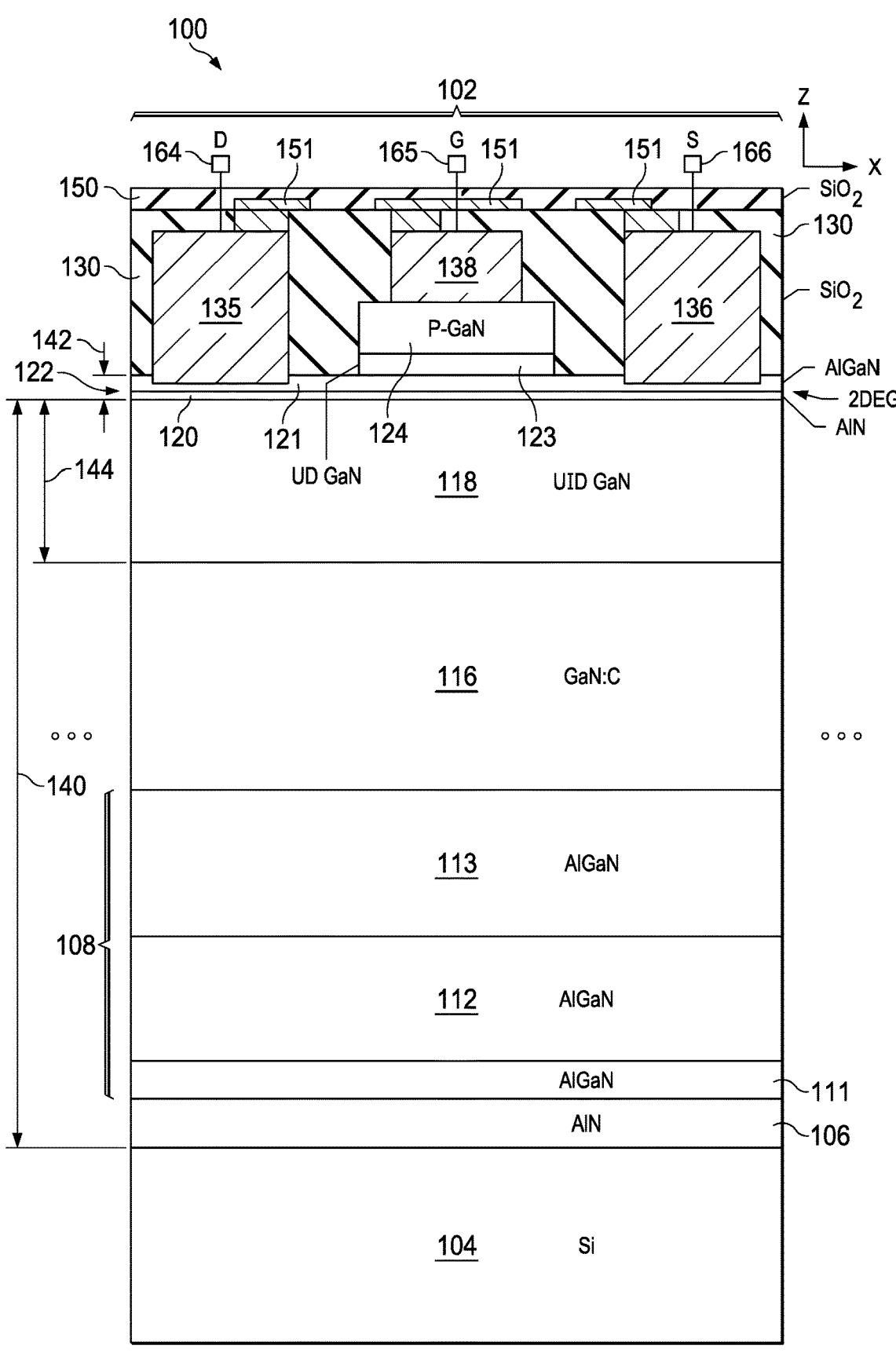
FIG. 1 is a partial sectional side elevation view of an electronic device with an enhancement mode GaN transistor gate structure having a substantially undoped gallium nitride interlayer under a doped gallium nitride layer according to one aspect.

In the drawings, like reference numerals refer to like elements throughout, and the various features are not necessarily drawn to scale. One or more operational characteristics of various circuits, systems and/or components are hereinafter described in the context of functions which in some cases result from configuration and/or interconnection of various structures when circuitry is powered and operating.

FIG. 1 shows an electronic device 100 with an enhancement mode gallium nitride transistor 102 that includes a gate structure having a gallium nitride interlayer under a p-doped gallium nitride layer to mitigate p-type dopant diffusion into an underlying hetero-epitaxy structure. The reduced dopant diffusion facilitates reduced current collapse as well as reduced PBTI and offset dependence. The enhancement mode transistor 102 is formed over a stack structure built over a substrate 104, such as silicon (Si) or a silicon-on-insulator (SOI) structure of any suitable thickness along the illustrated vertical (Z) direction. The illustrated portion of the electronic device 100 extends in a first lateral direction (X) as well as an orthogonal second lateral direction (a Y direction extending into and out of the page in FIG. 1). The electronic device 100 includes a buffer structure having an aluminum nitride (AlN) layer 106 and a multilayer composition graded aluminum gallium nitride stack 108 over the aluminum nitride layer 106. In another possible implementation, the buffer structure includes a dual superlattice stack with an intervening interlayer (not shown).

In the illustrated example, the aluminum nitride layer 106 has a thickness of 300-600 nm. The multilayer composition graded aluminum gallium nitride stack 108 in one example includes a first aluminum gallium nitride sublayer 111 having a first aluminum concentration over an aluminum nitride layer 106 of the buffer structure, a second aluminum gallium nitride sublayer 112 having a second aluminum concentration that is less than the first aluminum concentration over the first aluminum gallium nitride sublayer 111, and a third aluminum gallium nitride sublayer 113 having a third aluminum concentration that is less than the second aluminum concentration over the second aluminum gallium nitride sublayer 112. In one example, the first aluminum concentration is 60-70%, the second aluminum concentration is 40-50%, and the third aluminum concentration is 20-30%. In one example, the first aluminum gallium nitride sublayer 111 has a thickness of 300-600 nm, the second aluminum gallium nitride sublayer 112 has a thickness of 1.4-1.8 µm, and the third aluminum gallium nitride sublayer 111 has a thickness of 1.4-2.0 µm.

The electronic device 100 further includes a carbon doped gallium nitride layer 116 (e.g., labeled "GaN:C" in the figures) over the multilayer composition graded aluminum nitride stack 108, and a hetero-epitaxy structure having a gallium nitride layer 118 (e.g., labeled "UID GaN") over the carbon doped gallium nitride layer 116. In one example, the carbon doped gallium nitride layer 116 has a thickness of 0.5-2.0 µm. In this or another example, the gallium nitride layer 118 has a thickness of 0.1-0.5 µm. In one implementation, the gallium nitride layer 118 includes carbon. In one example, the gallium nitride layer 118 has a carbon doping concentration of about 2E16 atoms/cm$^3$ (e.g., $2 \times 10^{16}$ atoms*cm$^{-3}$) that is nearly three orders of magnitude lower than that of the underlying carbon doped gallium nitride layer 116 (e.g., about 1E19 atoms/cm$^3$ or $1 \times 10^{19}$ atoms*cm$^3$).

The hetero-epitaxy structure in one example includes an aluminum nitride layer 120 over the gallium nitride layer 118, and an aluminum gallium nitride layer 121 over the aluminum nitride layer 120. In another example, the aluminum nitride layer 120 is omitted. The hetero junction at the interface between the aluminum gallium nitride layer 121 and the gallium nitride layer 118 forms a two-dimensional electron gas region 122 (e.g., labeled "2DEG"). In one example, the layers 120 and 121 have a total thickness 142 of 10-30 nm. The electronic device 100 also has one or more transistors, including the enhancement mode transistor 102 in the illustrated implementation.

The example electronic device 100 in FIG. 1 includes a gallium nitride interlayer 123 over the aluminum nitride layer 120 of the hetero-epitaxy structure 120, 121. In one example, the gallium nitride interlayer 123 has a thickness of 50 nm or less, such as 10-20 nm. The electronic device 100 further includes a p-doped gallium nitride layer 124 over the gallium nitride interlayer 123 for the gate of the enhancement mode transistor 102. In one example, the gallium nitride layer 124 is doped with magnesium. The p-doped gallium nitride layer 124 has a peak p-type dopant concentration that is more than 10 times greater than a peak p-type dopant concentration of the gallium nitride interlayer 123. In one example, the peak p-type dopant concentration of the gallium nitride interlayer 123 is less than $1 \times 10^{19}$ atoms per cm$^3$. In one example, the p-doped gallium nitride layer 124 includes magnesium dopants and has a thickness of 50-200 nm, such as about 60-70 nm in one implementation. In another example implementation, the p-doped gallium nitride layer 124 has a thickness of about 100 nm. In yet another example, the p-doped gallium nitride layer 124 has a thickness of about 150 nm.

The electronic device 100 further includes a metallization structure with a first pre-metal dielectric (e.g., PMD) layer 130, for example, including silicon dioxide, with various conductive metal structures formed therein, including a drain contact or electrode 135, a source contact or electrode 136, and an enhancement mode transistor gate contact or electrode 138 over a portion of a top side of the p-doped gallium nitride layer 124. The metallization structure further includes one or more conductive vias provide an electrical interconnection of various transistor terminals for routing in a second metallization structure level.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness 140 of approximately 5.1 µm in one example. In certain implementation, the epitaxial growth is selectively interrupted after the aluminum gallium nitride layer 121 is formed, for example, to allow temperature stabilization prior to growing the gallium nitride interlayer 123. The gallium nitride layer 118 in the enhancement mode transistor 102 has a thickness 144 of approximately 0.45 µm. In the illustrated example, the aluminum gallium nitride layer 121 has a thickness of about 12 nm and an aluminum concentration of about 25%. In another example, the aluminum gallium nitride layer 121 has a thickness of about 17 nm and an aluminum concentration of about 20%.

Figure 17:
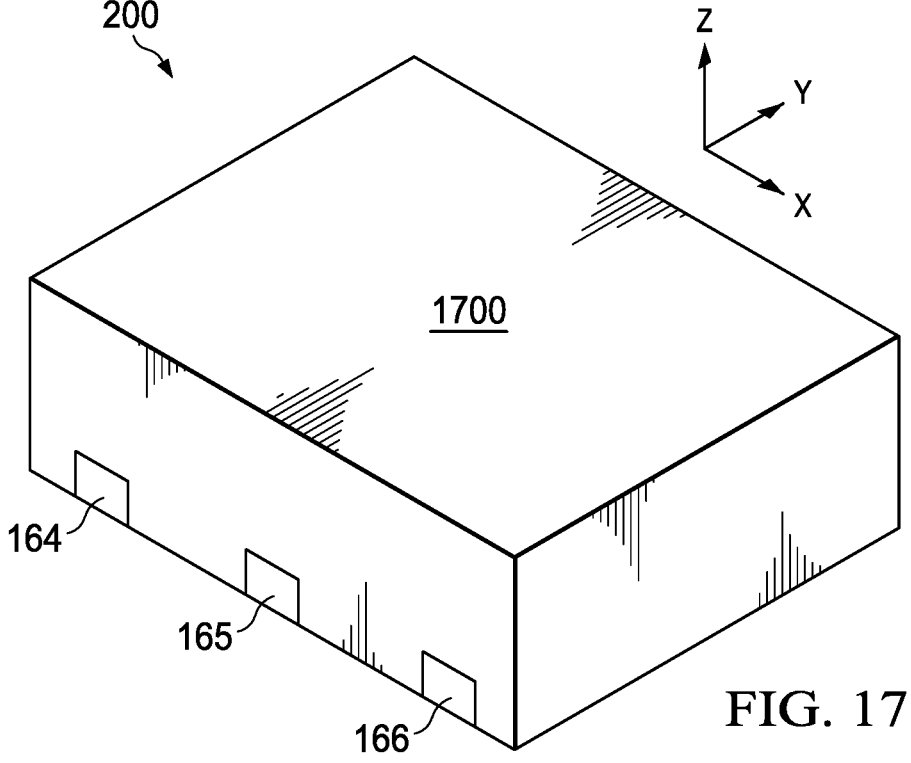
FIG. 17 is a perspective view of a packaged electronic device fabricated according to the method of FIG. 4.

The electronic device 100 in FIG. 1 further includes a second metallization structure level with a dielectric layer 150 (e.g., silicon dioxide) having one or more conductive routing features 151 (e.g., aluminum, copper, etc.), for example, to provide routing of drain, source and gate connections and associated signals to one another and/or to conductive bond pads, or other externally exposed conductive features by which the transistor 102 can be electrically interconnected with other circuitry, for example, using bond wires or lead frame electrical connections to integrated circuit leads, such as pins or pads in a packaged electronic device, as illustrated below in the example packaged electronic device 100 of FIG. 17.

The enhancement mode transistor 102 includes a gate 165 (e.g., labeled "G") over the p-doped gallium nitride layer 124, and a drain 164 (e.g., labeled "D") partially in the aluminum gallium nitride layer 121, where the drain 164 is spaced apart from the gate 165 along the lateral X direction. The enhancement mode transistor 102 also includes a source 166 (e.g., labeled "S") partially in the aluminum gallium nitride layer 121, where the source 166 is spaced apart from the gate 165 and from the drain 164 along the lateral X direction.

Figure 2:
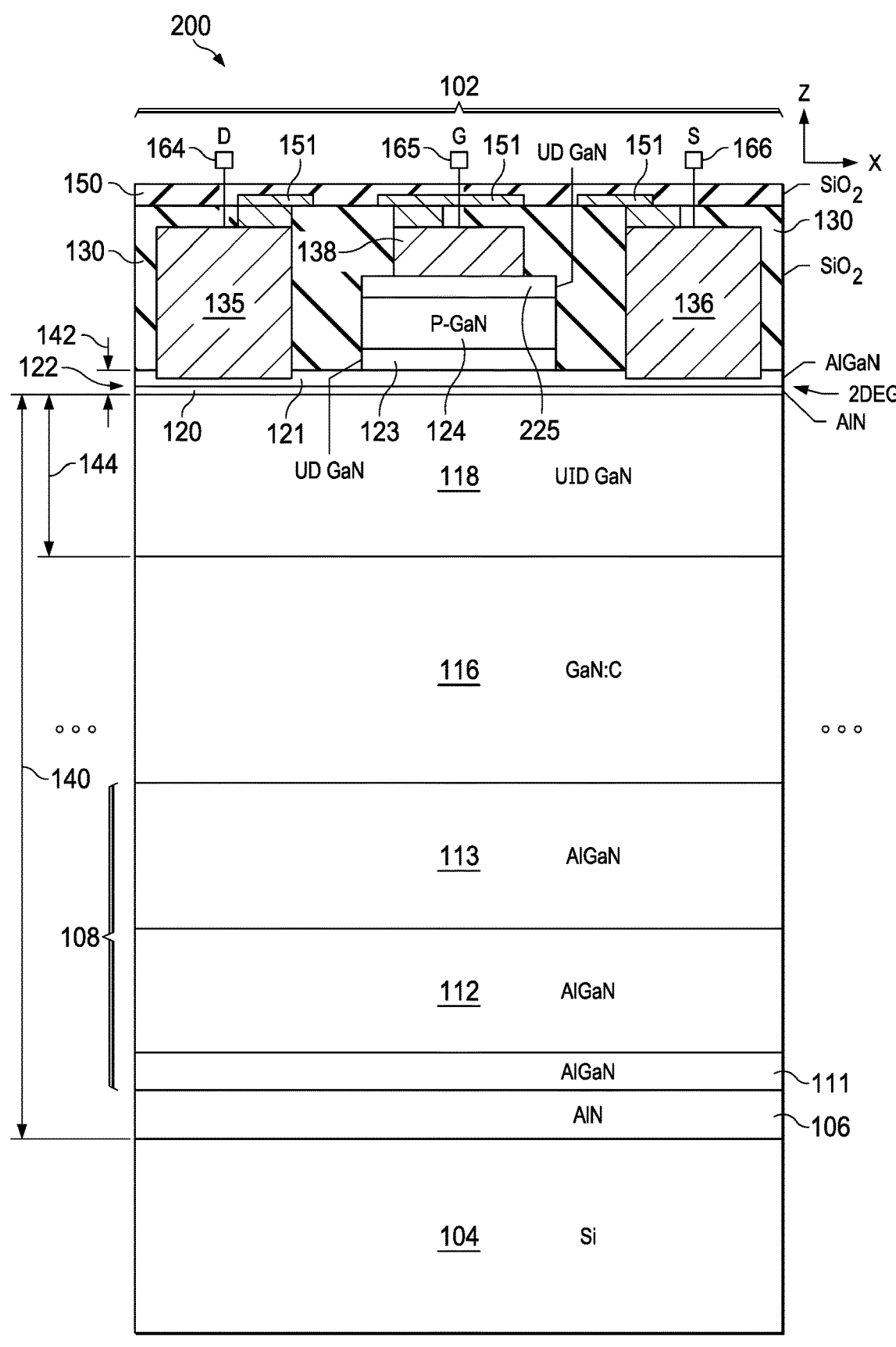
FIG. 2 is a partial sectional side elevation view of another electronic device with an enhancement mode GaN transistor gate structure having a substantially undoped gallium nitride interlayer under a doped gallium nitride layer and a second substantially undoped gallium nitride interlayer over the doped gallium nitride layer according to another aspect.

FIG. 2 shows a side view of another electronic device 200 with an enhancement mode GaN transistor gate structure having an undoped gallium nitride interlayer 123 under the doped gallium nitride layer 124, and a second undoped gallium nitride layer 225 over the doped gallium nitride layer 124 according to another aspect. In one example, the p-doped gallium nitride layer 124 is doped with magnesium. In this or another example, the second gallium nitride interlayer 225 has a thickness of 50 nm or less, such as 10-20 nm. In these or another example, the peak p-type dopant concentration of the second gallium nitride interlayer 225 is less than $1 \times 10^{19}$ atoms per $cm^3$. The electronic device 200 in FIG. 2 includes similarly numbered structures and features as described above in connection with FIG. 1. In addition, the electronic device 200 has the second gallium nitride interlayer 225 over the p-doped gallium nitride layer 124. The second gallium nitride interlayer 225 has a peak p-type dopant concentration that is less than 0.1 times the peak p-type dopant concentration of the p-doped gallium nitride layer 124. In this example, the gate 165 includes a gate contact 138 over the second gallium nitride interlayer 225.

Figure 3:
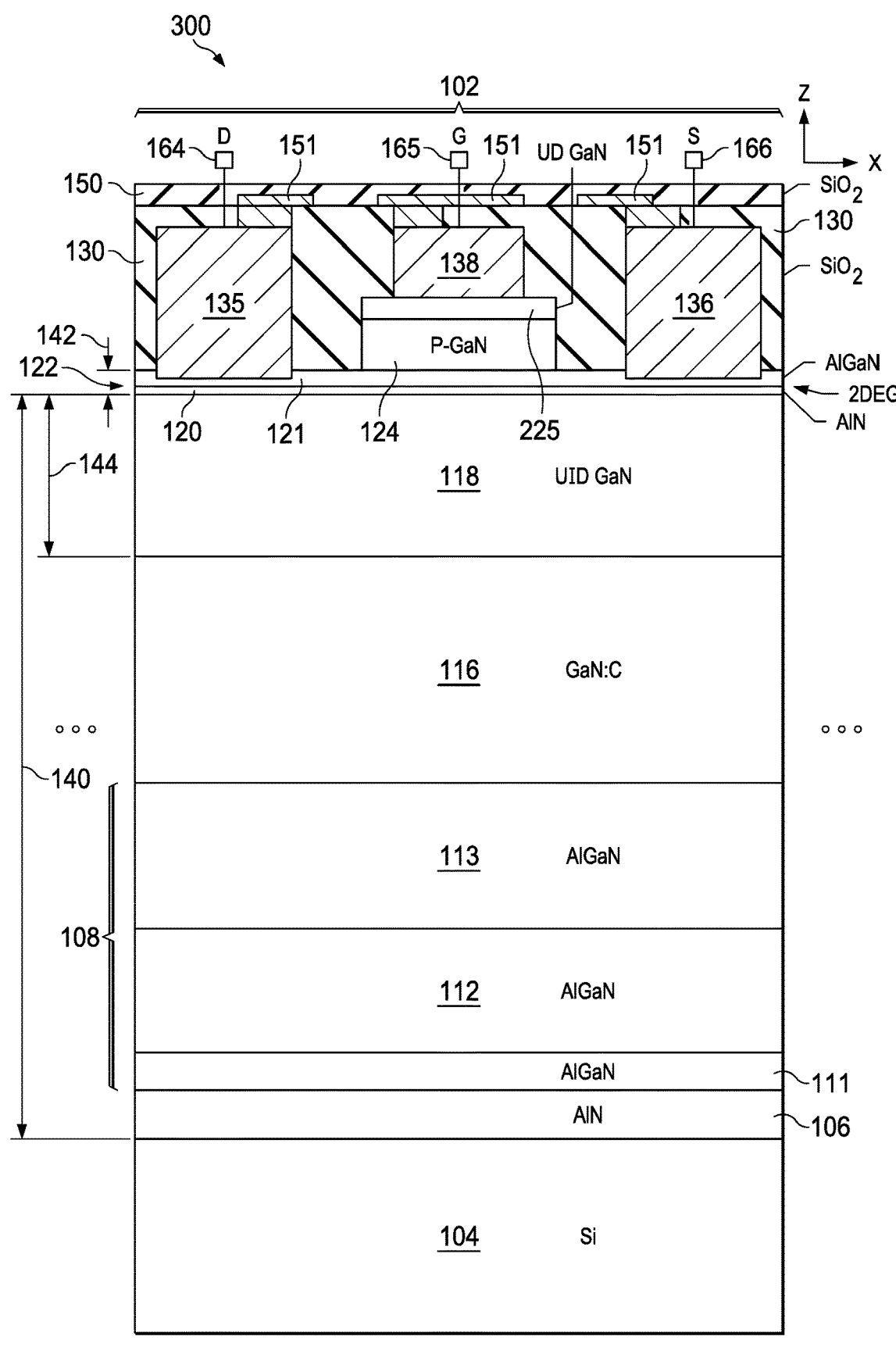
FIG. 3 is a partial sectional side elevation view of another electronic device with an enhancement mode GaN transistor gate structure having a substantially undoped gallium nitride interlayer over a doped gallium nitride layer according to another aspect.

FIG. 3 shows a side view of another electronic device with an enhancement mode GaN transistor gate structure having an undoped gallium nitride interlayer 225 over a doped gallium nitride layer according to another aspect. Unlike the respective electronic devices 100 and 200 of FIGS. 1 and 2, the p-doped gallium nitride layer 124 is over the aluminum gallium nitride layer 121 in the electronic device 300 of FIG. 3. Like the device 200 of FIG. 2, the electronic device 300 in FIG. 3 includes a gallium nitride interlayer 225 over the p-doped gallium nitride layer 124, and an enhancement mode transistor 102 having a gate 165 over the gallium nitride interlayer 225, a drain 164 partially in the hetero-epitaxy structure and spaced apart from the gate 165, and a source 166 partially in the hetero-epitaxy structure 120, 121 and spaced apart from the gate 165 and from the drain 164. As in the example of FIG. 2, moreover, the p-doped gallium nitride layer 124 in FIG. 3 has a peak p-type dopant concentration that is more than 10 times greater than a peak p-type dopant concentration of the gallium nitride interlayer 225. In one example, the gallium nitride interlayer 225 has a thickness of 50 nm or less, such as 10-20 nm. In one example, the peak p-type dopant concentration of the gallium nitride interlayer 225 is less than $1 \times 10^{19}$ atoms per $cm^3$, and the electronic device 300 of FIG. 3 includes similarly numbered structures and features as described above in connection with FIG. 1.

Referring now to FIGS. 4-16, FIG. 4 shows an example method 400 of making an electronic device according to a further aspect, and FIGS. 5-15 show partial side views of the electronic device 200 of FIG. 2 undergoing fabrication processing according to the method of FIG. 4. The method 400 also includes example acts and events that can be used in fabricating the electronic device 100 of FIG. 1 and/or the electronic device 300 of FIG. 3.

Figure 5:
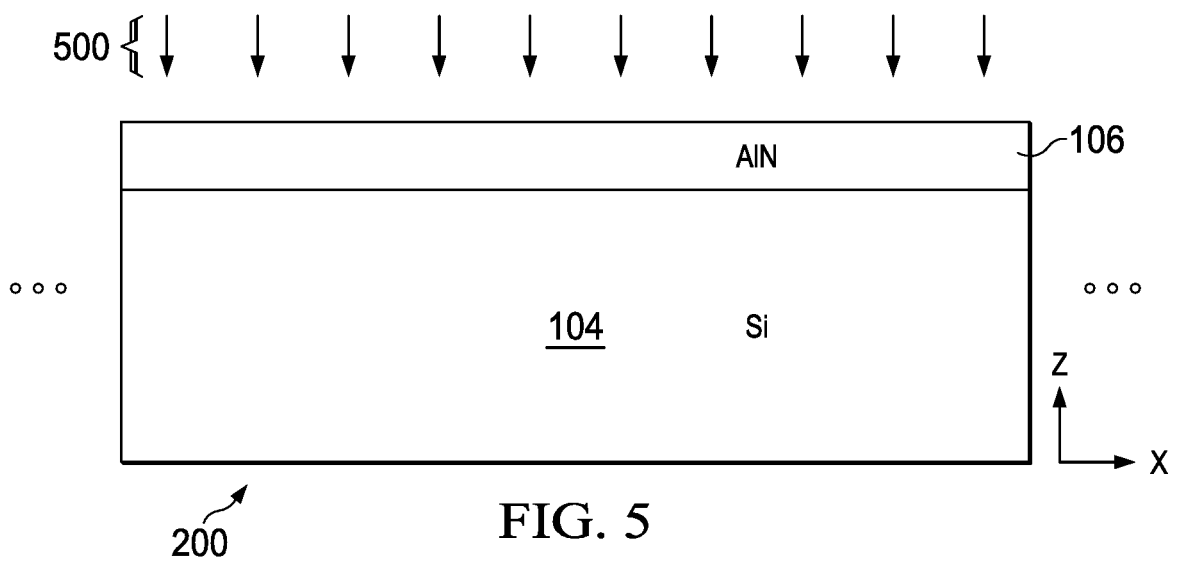
FIGS. 5-16 are partial sectional side elevation views of the electronic device of FIG. 2 undergoing fabrication processing according to the method of FIG. 4.

The method 400 begins with a starting substrate, such as a silicon wafer, an SOI wafer, etc. An epitaxial deposition process or multiple epitaxial deposition processes are performed at 401, including forming the buffer structure 108, 116 in FIGS. 1-3 over the substrate 104. At 402, an aluminum nitride layer is formed over the substrate. FIG. 5 shows one example, in which the aluminum nitride layer 106 in the above electronic devices 100 and 200 is deposited over an upper surface of the silicon substrate 104 using an epitaxial deposition process 500. In one example, the process 500 includes depositing aluminum nitride at a temperature of 1000-1150° C. to a thickness of 300-600 nm.

Figure 6:
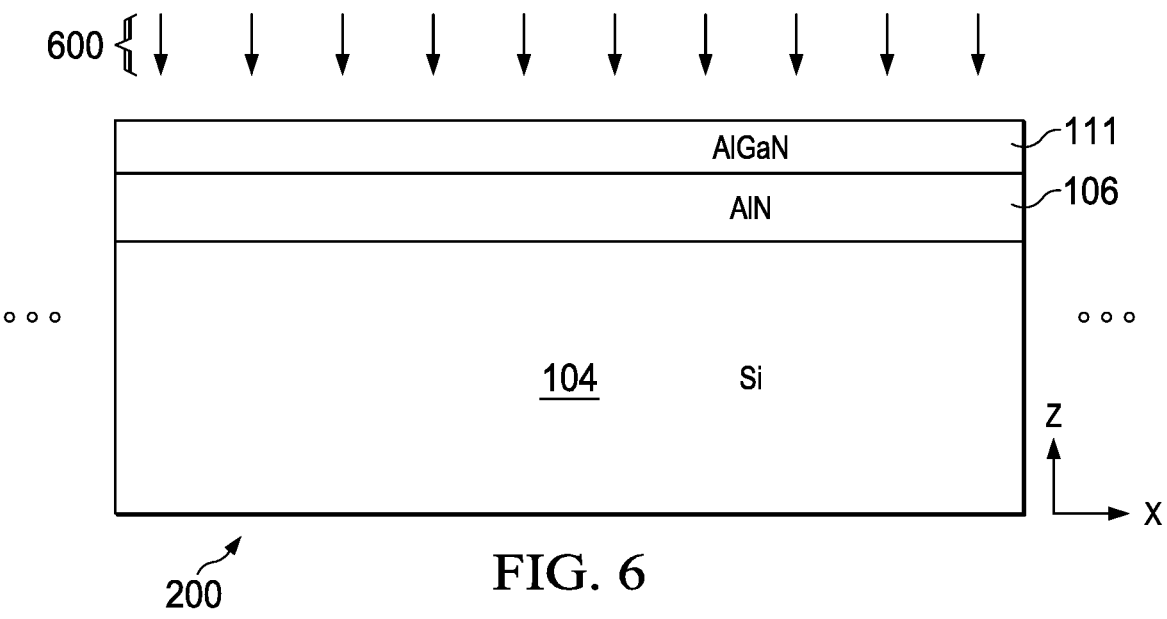

The example method 300 also includes formation of the buffer at 403. In the illustrated example, the buffer formation at 403 includes forming the multilayer composition graded aluminum gallium nitride stack 108 over the aluminum nitride layer 106 in FIGS. 1-3. In another example, the buffer is formed at 403 as a dual superlattice structure with an interlayer (not shown). In the illustrated example, the buffer formation at 403 includes performing an epitaxial deposition process at 404 that forms a first aluminum gallium nitride sublayer over the aluminum nitride layer 106. FIG. 6 shows one example, in which an epitaxial deposition process 600 is performed that deposits the first aluminum gallium nitride sublayer 111 over the aluminum nitride layer 106. In one example, the process 600 deposits the first aluminum gallium nitride sublayer 111 with an aluminum content of 60-70% to a thickness of 300-600 nm at a process temperature of 900-1100° C. In one implementation, moreover, the process 600 uses ethane, hexane or other extrinsic carbon source gas to form the first aluminum gallium nitride sublayer 111 with a carbon concentration of 1E17-1E18 atoms/$cm^3$.

Figures 7, 8:
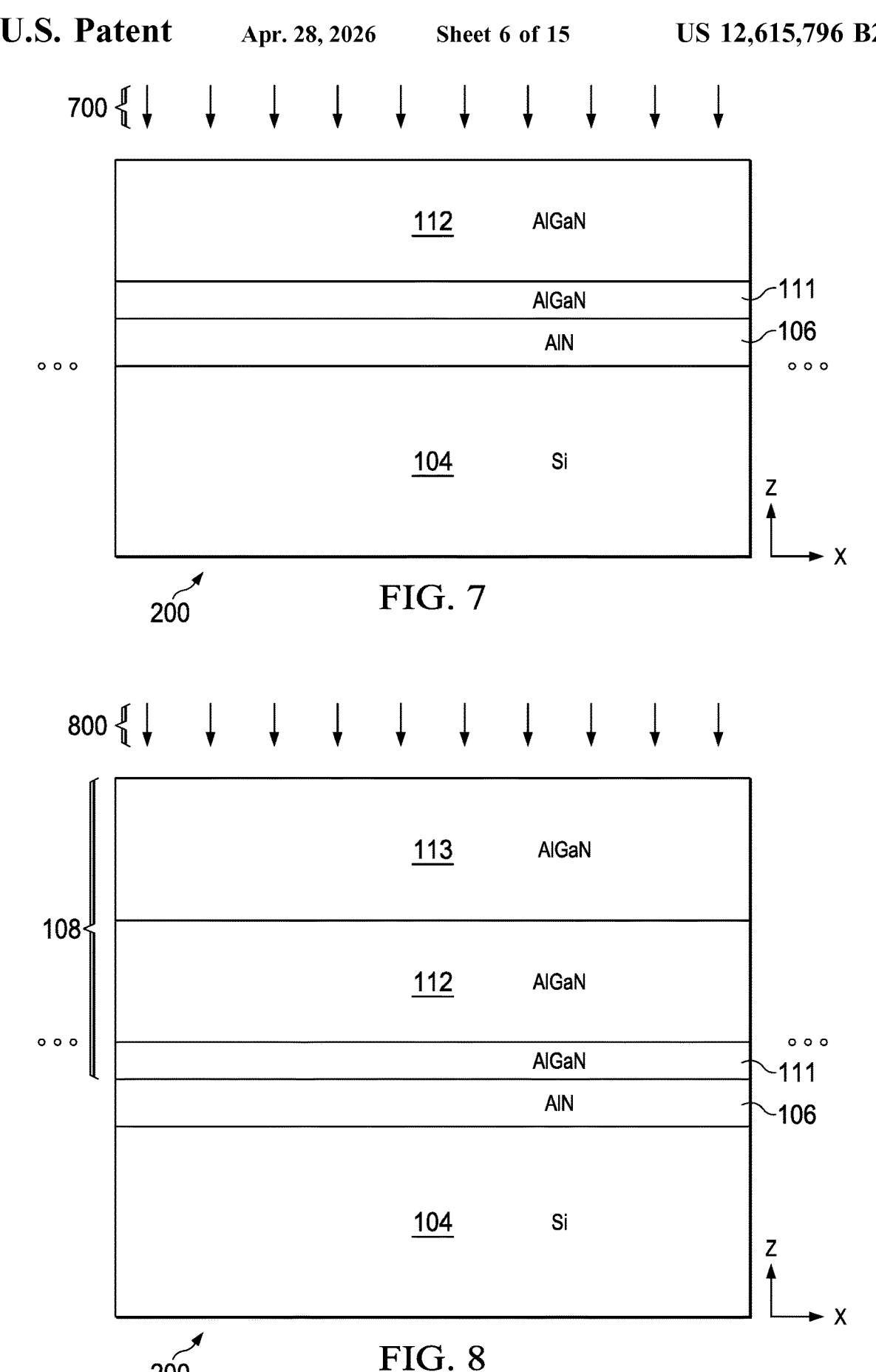

The method 400 continues at 406 with continuing epitaxial deposition or performing another epitaxial deposition process that forms the second aluminum gallium nitride sublayer 112 over the first aluminum gallium nitride sublayer 111. FIG. 7 shows one example, in which a second epitaxial deposition process 700 is performed that deposits the second aluminum gallium nitride sublayer 112 with an aluminum content of 40-50% to a thickness of 1.4-1.8 μm using a process temperature of 900-1100° C. In one implementation, moreover, the process 700 uses ethane, hexane or other extrinsic carbon source gas to form the second aluminum gallium nitride sublayer 112 with a carbon concentration of 1E17-1E19 atoms/$cm^3$.

The method 400 continues at 408 with continuing epitaxial deposition or performing a further epitaxial deposition process that forms the third aluminum gallium nitride sublayer 113 over the second aluminum gallium nitride sublayer 112. FIG. 8 shows one example, in which a third epitaxial deposition process 800 is performed that deposits the third aluminum gallium nitride sublayer 113 with an aluminum content of 20-30% to a thickness of 1.4-2.0 μm using a process temperature of 1000-1100° C. In one implementation, moreover, the process 800 uses ethane, hexane or other extrinsic carbon source gas to form the third aluminum gallium nitride sublayer 113 with a carbon concentration of 1E17-1E19 atoms/cm³.

Figure 9:
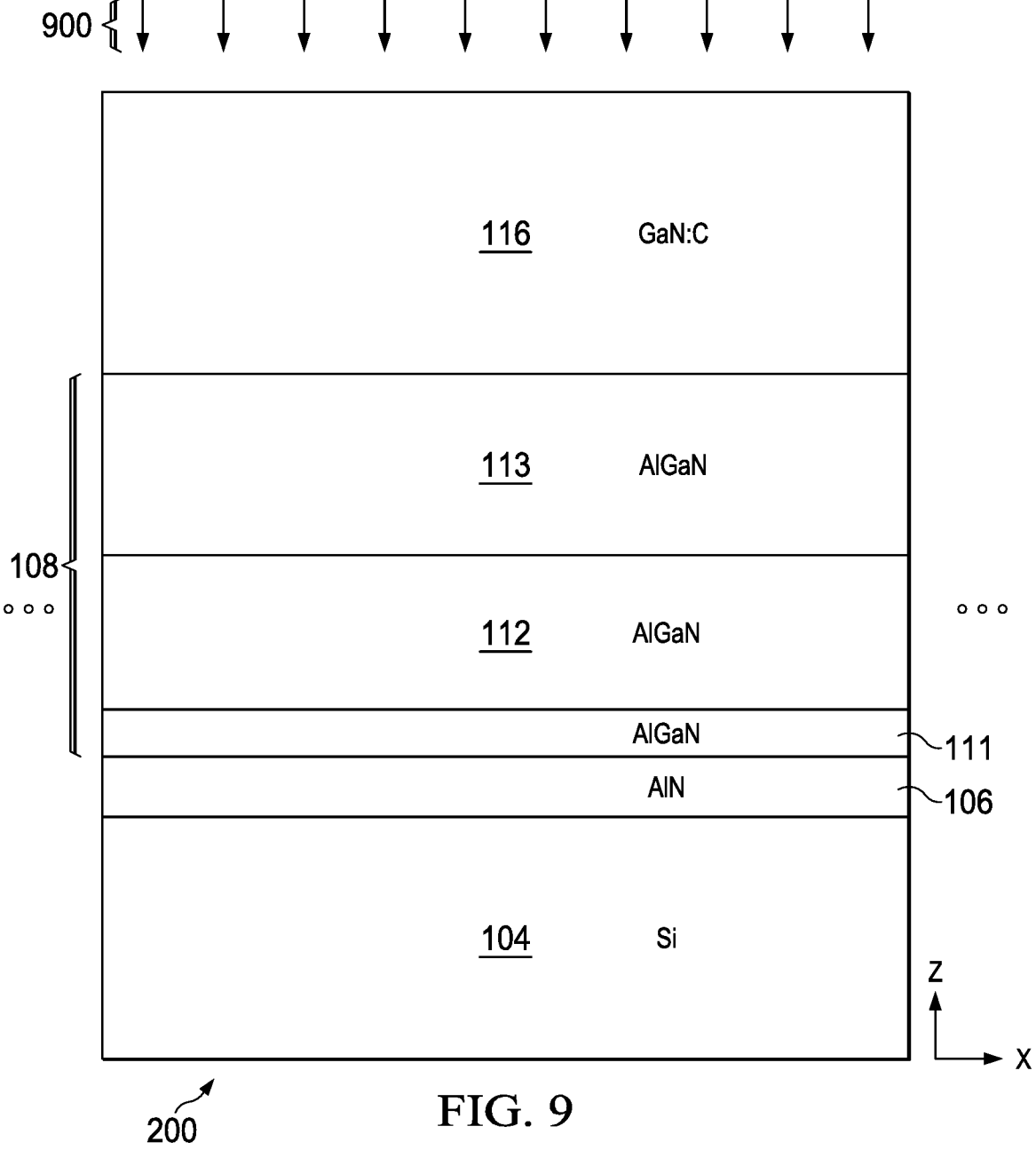

The method 400 continues at 410 with continuing epitaxial deposition or performing another epitaxial deposition process that deposits a gallium nitride layer using an extrinsic carbon source gas. FIG. 9 shows one example, in which an epitaxial deposition process 900 is performed that deposits the carbon doped gallium nitride layer 116 (GAN:C) over the top side of the final gallium nitride sublayer 113 of the multilayer composition graded aluminum gallium nitride stack 108. In one example, the process 900 deposits the carbon doped gallium nitride layer 116 to a thickness of 1.0-2.5 μm at a process temperature of 900-1050° C. using hexane or other extrinsic carbon gas to provide the gallium nitride layer 116 with a carbon concentration of 1E18-1E20 atoms/cm³. The use of the extrinsic carbon source gas at 402 and 410 in certain implementations facilitates enhanced carbon doping concentration in the gallium nitride layer 116 to mitigate current collapse, and facilitates uniform carbon concentration across the lateral extent of the processed wafer during fabrication, while still allowing relatively high temperature epitaxial growth to enhance the quality of the gallium nitride layer 116 and the underlying concentration graded aluminum gallium nitride layers 111, 112 and 113. In other implementations, other ones of the buffer layers or sublayers are epitaxially deposited using an extrinsic carbon source gas to provide similar or further benefits regarding current collapse and carbon concentration uniformity.

Figure 10:
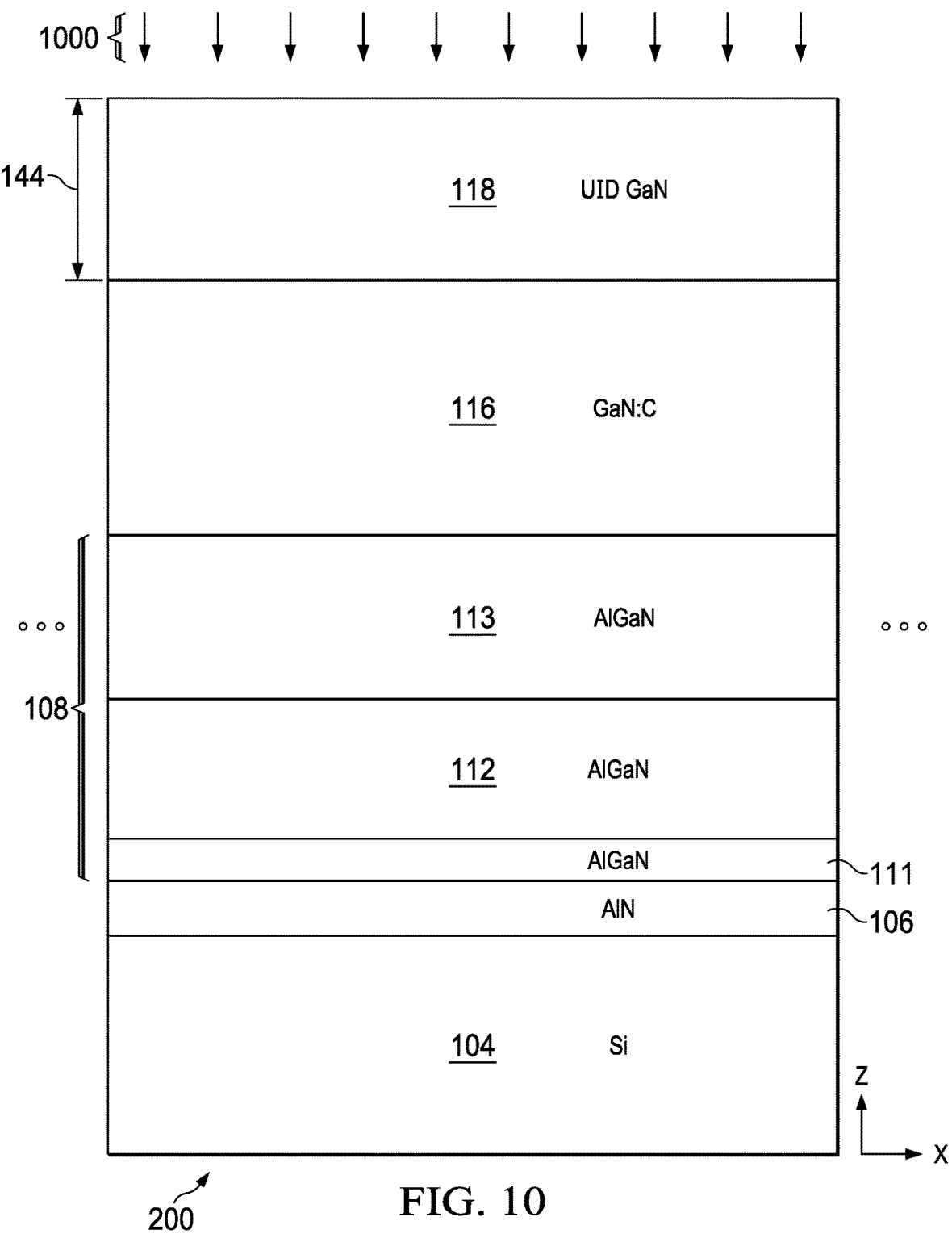

The method 400 continues at 412 in FIG. 4 with formation of the UID gallium nitride layer 118 over the top side of the carbon doped gallium nitride layer 116. FIG. 10 shows one example, in which an epitaxial deposition process 1000 is performed that deposits the gallium nitride layer 118 to a thickness 144. In one example, the process 1000 deposits the gallium nitride layer 118 to a thickness of 0.1-0.5 μm at a process temperature of 950-1050° C., with intrinsic carbon doping to a concentration of 1E15-1E17 atoms/cm³.

Figure 11:
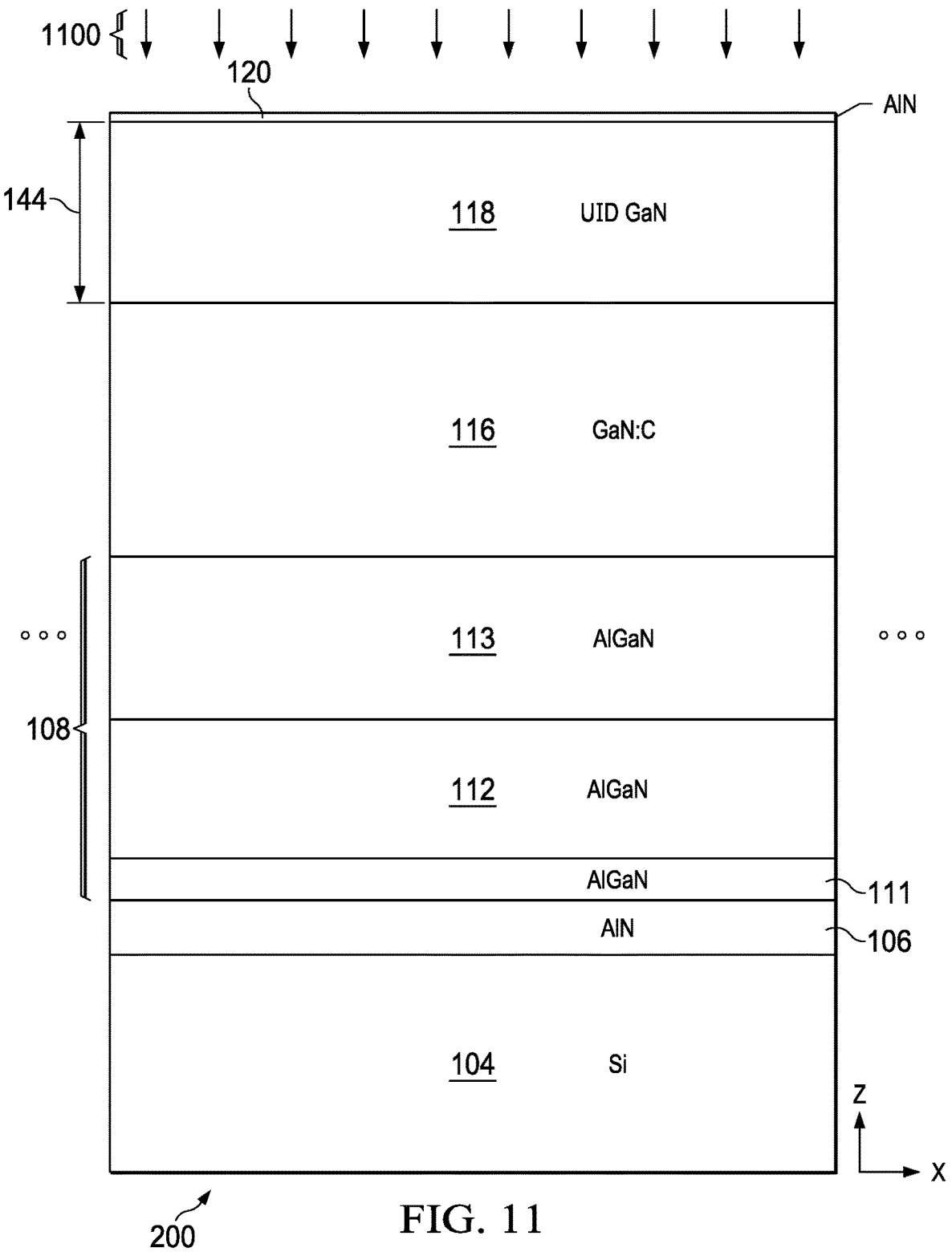
Figure 12:
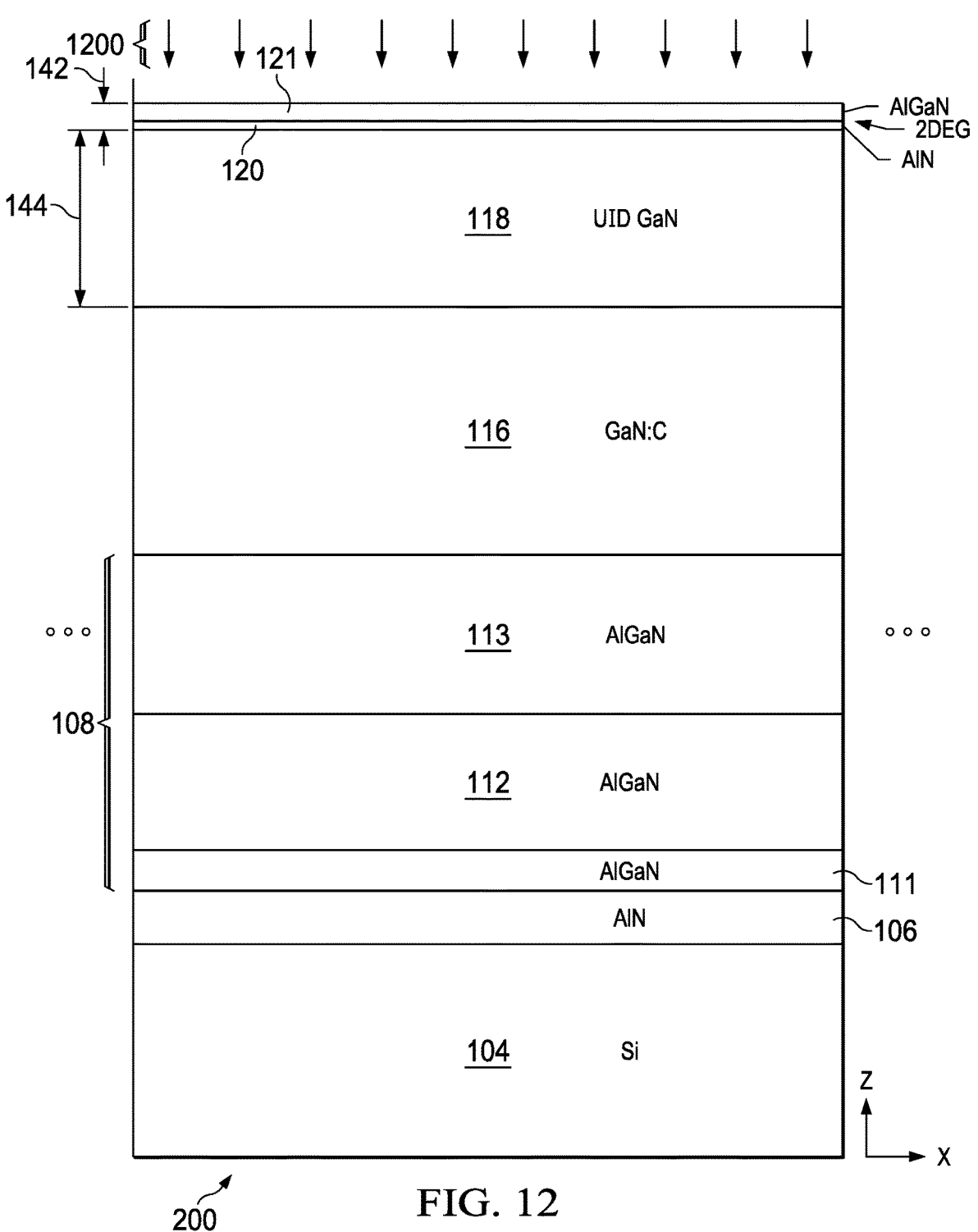
Figure 13:
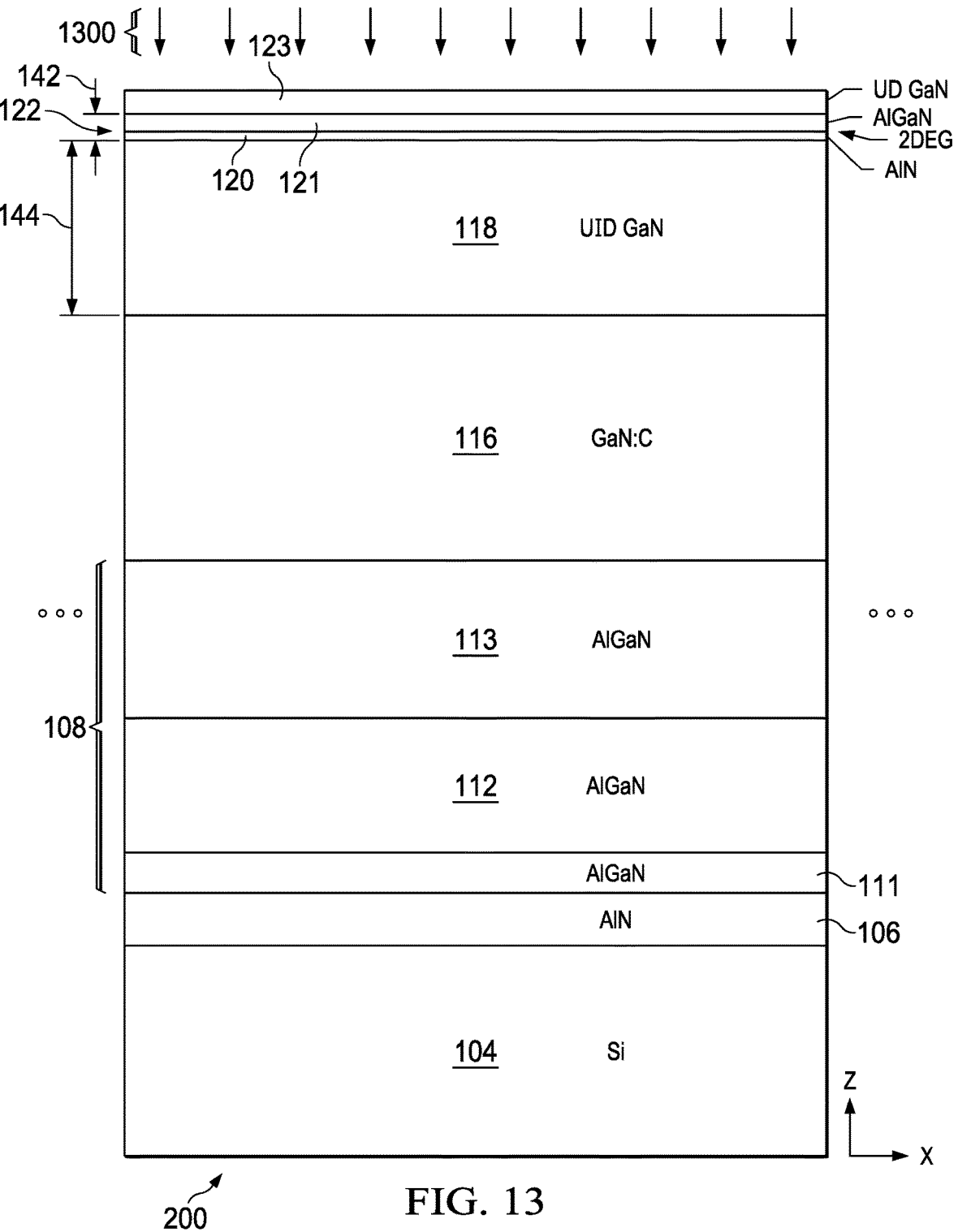

The method 400 continues at 414 with formation of the aluminum nitride and aluminum gallium nitride layers 120 and 121 of the hetero-epitaxy structure 120, 121 over the buffer structure. This example includes forming the aluminum nitride layer 120 at 416 over the top side of the gallium nitride layer 118 using a process 1100 as shown in FIG. 11. In one example, the process 1100 deposits the aluminum nitride layer 120 to a thickness of about 10 Å at a process temperature of 900-1100° C. At 418, the aluminum gallium nitride layer 121 is formed over the aluminum nitride layer 120 using an epitaxial deposition process 1200 shown in FIG. 12. In one example, the process 1200 forms the aluminum gallium nitride layer 121 to a thickness of 10-30 nm at a process temperature of 900-1100° C.

In one example implementation, the method 400 includes interrupting the epitaxial deposition at 421 after the epitaxial deposition process 1200 that deposits the aluminum gallium nitride layer 121 over the aluminum nitride layer 120. After interrupting the epitaxial deposition at 421, this example includes performing a second epitaxial deposition process 1300 in FIG. 13 at 422 using no p-type dopants to form the gallium nitride interlayer 123 over the aluminum nitride layer 120. In one example, the growth interruption at 421 includes stopping the epitaxial growth by turning off or discontinuing source gas flow and allowing the process temperature to transition down to a lower temperature associated with the deposition at 422 (e.g., from 1050 to 930° C.). Then, the growth is begun via the deposition process 1300 in FIG. 13 to form the gallium nitride interlayer 123, for example, by initiating or starting provision of source gasses containing gallium and nitrogen with no magnesium or other p-type dopant source gas at 422.

The growth interruption at 421 in certain examples helps to mitigate subsequent diffusion of magnesium into the aluminum gallium nitride layer 121 and facilitates improved device performance with respect to current collapse and PBTI. Moreover, the growth interruption at 421 facilitates making the gallium nitride interlayer 123 thinner to get the same diffusion reduction with a thinner undoped GaN layer between the P-GaN layer 124 and the AlGaN barrier layer 121.

Figure 14:
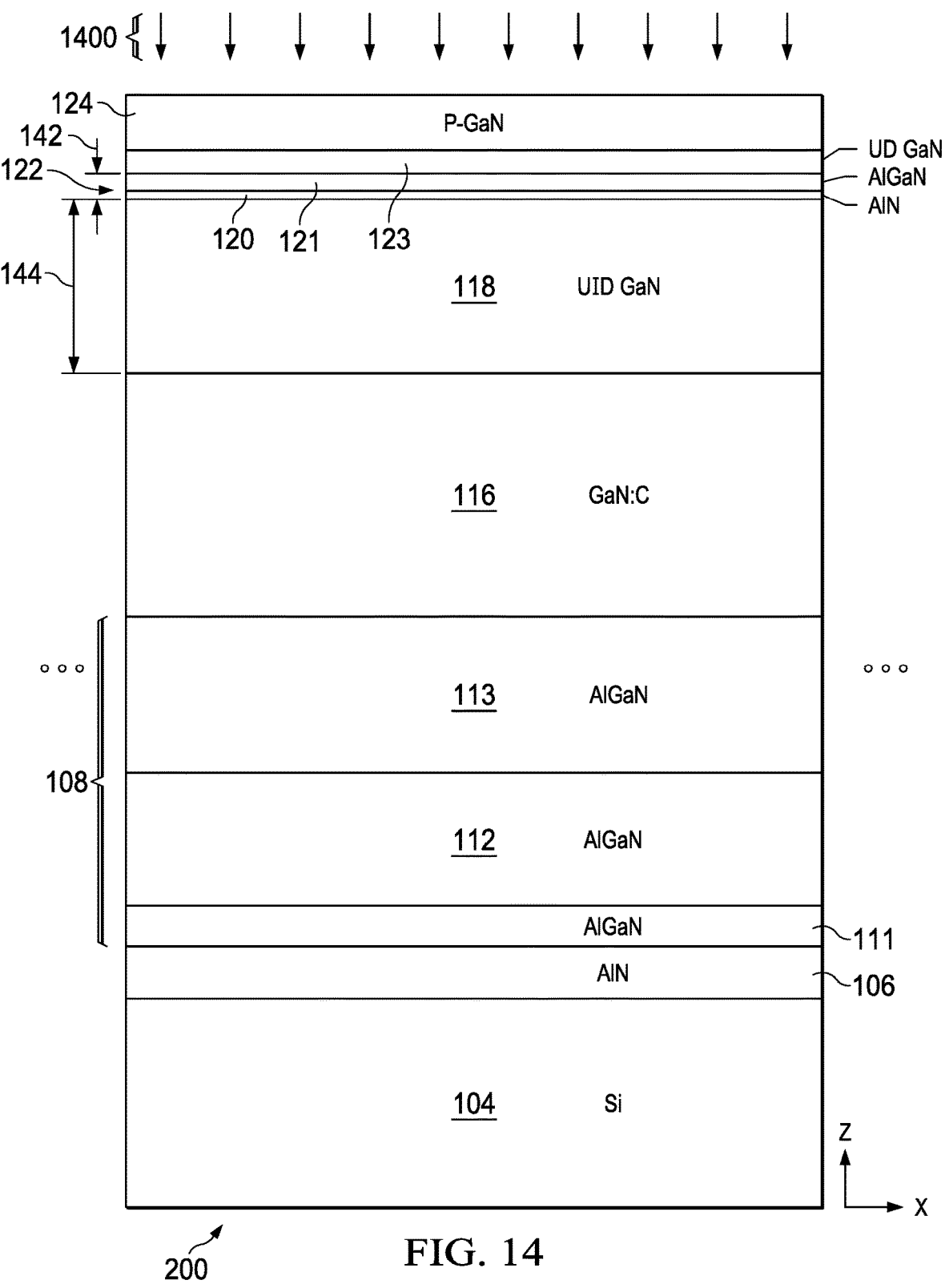
Figure 15:
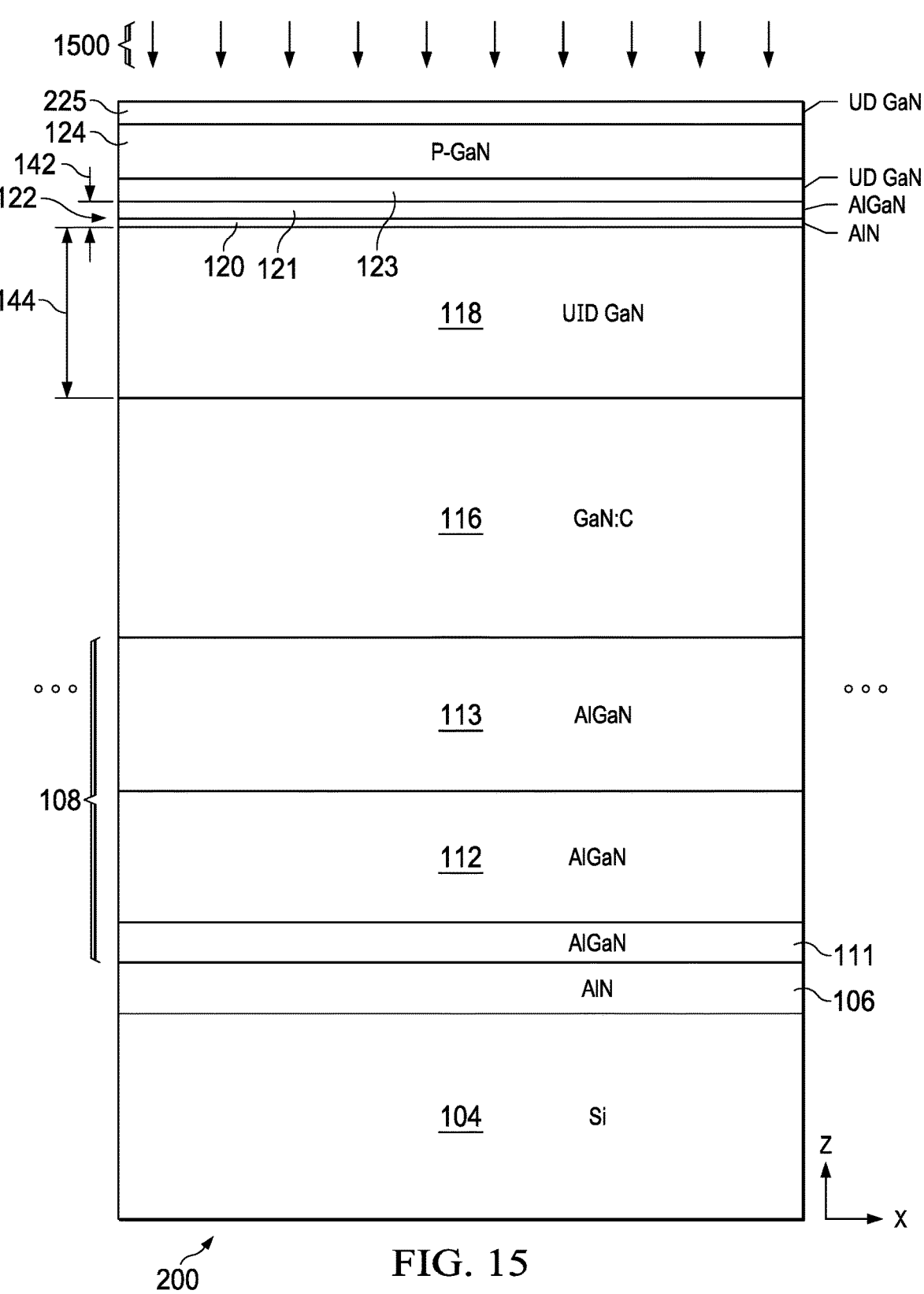

The method 400 continues at 423 with continuing epitaxial deposition or performing another (e.g., a third) epitaxial deposition process to form the p-doped gallium nitride layer 124 over the gallium nitride interlayer 123. FIG. 14 shows one example, in which an epitaxial deposition process 1400 is performed using magnesium or other p-type dopants that deposits the p-doped gallium nitride layer 124 over the gallium nitride interlayer 123. The layers 123 and 124 are then patterned in one example, to continue fabricating the electronic device 100 in FIG. 1. In the illustrated example, to form the electronic device 200 of FIG. 2, the method 400 continues at 424 in FIG. 4 with continuing epitaxial deposition or performing another epitaxial deposition process using no p-type dopants to form the second gallium nitride interlayer 225 over the p-doped gallium nitride layer 124. FIG. 15 shows one example, in which a fourth epitaxial deposition process 1500 is performed using no magnesium or other p-type dopants to form the second gallium nitride interlayer 225 over the p-doped gallium nitride layer 124.

Figure 16:
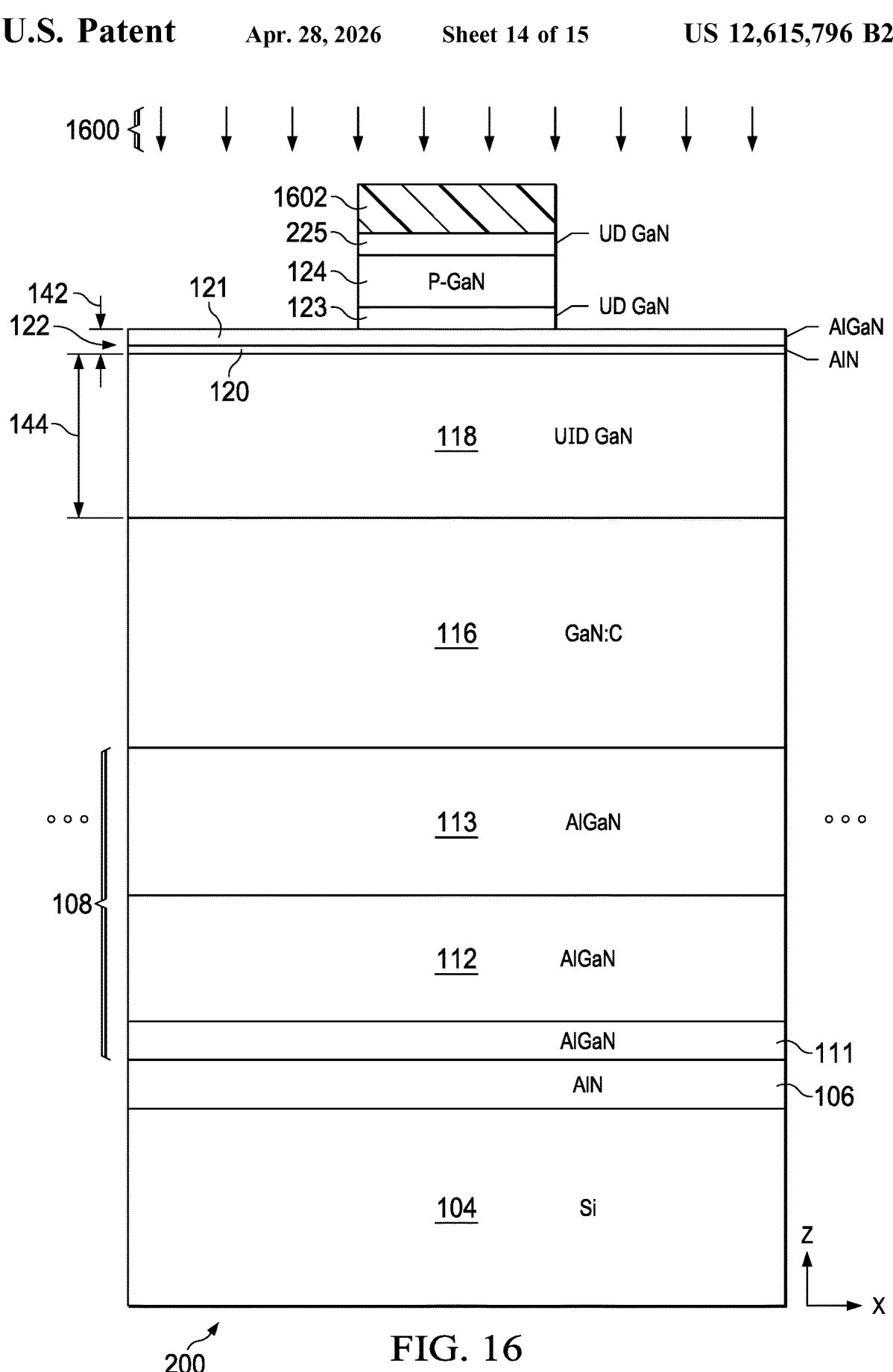

The method continues at 425 in FIG. 4 with patterning the layers 123, 124 and 225 to form a patterned structure underlying the enhancement mode transistor gate. FIG. 16 shows one example, in which an etch process 1600 is performed using a patterned etch mask 1602 to pattern exposed portions of the layers 123, 124 and 225, after which the etch mask 1602 is removed. The method 400 further also includes forming the gate, drain and source structures (e.g., 131, 132, 134, 135, 136 and 138 in FIG. 2 above, as well as metallization and other backend processing at 426. In this manner, the process 400 includes forming the enhancement mode transistor 102 as shown in FIG. 2 including a gate over the hetero epitaxy structure, a drain partially in the hetero epitaxy structure, and a source partially in the hetero-epitaxy structure. This provides the structures shown in FIG. 2 above, and the process 400 continues at 428 with wafer level testing (e.g., wafer probe). The process 400 further includes packaging at 430, for example, including singulating or separating individual died portions of a processed wafer, and packaging the individual dies using any suitable packaging structure, such as lead frames, molded structures, system on module packaging, chip on die packaging, substrates with conductive features, or combinations thereof to provide a finished electronic device, such as an integrated circuit that includes the transistor 102, alone or along with other circuits (not shown), or a packaged transistor electronic device including a single transistor component 101 or 102.

FIG. 17 shows one example of the finished packaged electronic device 200, including a molded or ceramic package structure 1700 with conductive leads for the example depletion mode GaN transistor drain 164, gate 165 and source 166. The example method 400 further includes final device testing at 432 in FIG. 4.

In another implementation, the processing at 422 is omitted, and the upper gallium nitride interlayer 225 is formed at 424, and all other method steps are implemented as described above to produce the electronic device of FIG. 3 above. In one example, this includes performing the epitaxial deposition process at 423 (e.g., FIG. 14 above) using magnesium or other p-type dopants to deposit the p-doped gallium nitride layer 124 over the aluminum gallium nitride layer 121, performing an epitaxial deposition process at 424 (e.g., FIG. 15 above) using no p-type dopants to form the gallium nitride interlayer 225 over the p-doped gallium nitride layer 124, and forming the enhancement mode transistor 102 at 425 and 426 having the gate 165 over the gallium nitride interlayer 225, the drain 164 partially in the hetero-epitaxy structure and spaced apart from the gate 165, and the source 166 partially in the hetero-epitaxy structure and spaced apart from the gate 165 and from the drain 164.

In the examples of FIGS. 2 and 3, the upper undoped gallium nitride layer 225 helps improve the upper surface of the p-doped gallium nitride layer 124, which helps in subsequent formation of the gate contact 138 (e.g., aluminum or copper). In this regard, the use of relatively high magnesium dopant concentration (e.g., $1 \times 10^{19}$ atoms per $cm^3$ or more), especially for growth of a relatively thick p-doped gallium nitride layer 124 (e.g., 70-80 nm), may cause development of hexagonal surface lattice structures over the top of the layer 124, and a high concentration of magnesium at the top of the layer 124. The surface structure and magnesium concentration over the top side of the p-doped gallium nitride layer 124 may impede formation of the overlying gate contact 138. The upper, substantially undoped gallium nitride layer 225 in these examples helps with the subsequent gate contact formation by allowing some upward diffusion of magnesium from the layer 124 into the upper undoped gallium nitride layer 225, and the subsequent top surface of the upper gallium nitride interlayer 225 is easier to contact with the material of the gate contact 138.

In certain example implementations, the gallium nitride interlayers 123 and/or 225 provide substantially undoped gallium nitride to mitigate magnesium diffusion into the aluminum gallium nitride barrier layer 121, for example, having a magnesium concentration less than 1E17 atoms/$cm^3$. In certain examples, the gallium nitride interlayers 123 and/or 225 have peak magnesium concentrations between 1 and 2 orders of magnitude lower than the peak magnesium concentration of the p-doped gallium nitride layer 124. One example includes a 50 nm thick substantially undoped gallium nitride interlayer 123, and a 150 nm thick p-doped gallium nitride layer 124. One implementation includes a 50 nm thick lower gallium nitride interlayer 123, a 100 nm thick p-doped gallium nitride layer 124, and an overlying 50 nm thick gallium nitride interlayer 225. Another implementation includes a 150 nm thick p-doped gallium nitride layer 124, and an overlying substantially undoped gallium nitride interlayer 225 having a thickness of 50 nm. In certain example, the incorporation of the substantially undoped gallium nitride interlayer 123 between the aluminum gallium nitride barrier layer 121 and the overlying p-doped gallium nitride layer 124 provides a diffusion barrier of undoped gallium nitride, which allows a significant reduction in the magnesium concentration such that the magnesium concentration has a peak value in the aluminum gallium nitride barrier layer 121 that is at least one order of magnitude less than the peak magnesium concentration in the p-doped gallium nitride layer 124. In addition, the use of the upper substantially undoped gallium nitride interlayer 225 (e.g., alone in FIGS. 3 and 20, or in combination with the lower undoped gallium nitride interlayer 123 in FIGS. 2 and 19) also helps in reducing the magnesium concentration in the aluminum gallium nitride barrier layer 121, and further facilitates formation of the gate contact 138 in the enhancement mode transistor 102.

Modifications are possible in the described examples, and other implementations are possible, within the scope of the claims.

What is claimed is:

1. An electronic device, comprising:
 a substrate;
 a buffer structure over the substrate;
 a first gallium nitride layer over the buffer structure;
 an aluminum gallium nitride layer on the first gallium nitride layer;
 a gate structure having a second gallium nitride layer, a third gallium nitride layer, and a gate contact, wherein:
  the second gallium nitride layer is directly on the aluminum gallium nitride layer;
  the third gallium nitride layer is directly on the second gallium nitride layer; and
  the gate contact is over the third gallium nitride layer;
 a drain contact spaced apart from the gate contact; and
 a source contact spaced apart from the gate contact and from the drain contact;
 wherein the second gallium nitride layer has a first peak p-type dopant concentration less than $1 \times 10^{17}$ atoms/$cm^3$; and
 wherein the third gallium nitride layer has a second peak p-type dopant concentration that is more than 10 times greater than the first peak p-type dopant concentration.

2. The electronic device of claim 1, wherein the second gallium nitride layer has a thickness of 50 nm or less.

3. The electronic device of claim 1, wherein the second gallium nitride layer has a thickness of 10-20 nm.

4. The electronic device of claim 1, wherein the third gallium nitride layer is doped with magnesium (Mg).

5. The electronic device of claim 1, further including:
 a first aluminum nitride layer disposed between the first gallium nitride layer and the aluminum gallium nitride layer;
 a second aluminum nitride layer disposed over the substrate; and
 a second aluminum gallium nitride layer disposed over the second aluminum nitride layer.

6. The electronic device of claim 1, wherein the gate contact is directly on the third gallium nitride layer.

7. The electronic device of claim 1, further including:
 a fourth gallium nitride layer on the third gallium nitride layer, the fourth gallium nitride layer having a third peak p-type dopant concentration that is less than 0.1 times the second peak p-type dopant concentration, wherein the gate contact is directly on the fourth gallium nitride layer.

8. An electronic device, comprising:
 a substrate;
 a buffer structure over the substrate;
 a first gallium nitride layer over the buffer structure;
 an aluminum gallium nitride layer on the first gallium nitride layer;
 a gate structure having a second gallium nitride layer, a third gallium nitride layer, and a gate contact, wherein:

the second gallium nitride layer is directly on the aluminum gallium nitride layer;

the third gallium nitride layer is directly on the second gallium nitride layer; and the gate contact is directly on the third gallium nitride layer;

a drain contact spaced apart from the gate contact; and a source contact spaced apart from the gate contact and from the drain contact;

wherein the third gallium nitride layer has a first peak p-type dopant concentration less than $1\times10^{17}$ atoms/cm$^3$; and wherein the second gallium nitride layer has a second peak p-type dopant concentration that is more than 10 times greater than the first peak p-type dopant concentration.

9. The electronic device of claim 8, wherein the third gallium nitride layer has a thickness of 50 nm or less.

10. The electronic device of claim 8, wherein the third gallium nitride layer has a thickness of 10-20 nm.

11. The electronic device of claim 8, wherein the second gallium nitride layer is doped with magnesium (Mg).

12. The electronic device of claim 8, further including:

a first aluminum nitride layer disposed between the first gallium nitride layer and the aluminum gallium nitride layer;

a second aluminum nitride layer disposed over the substrate; and a second aluminum gallium nitride layer disposed over the second aluminum nitride layer.

13. The electronic device of claim 1, wherein the gate contact includes aluminum or copper.

14. The electronic device of claim 8, wherein the gate contact includes aluminum or copper.

15. The electronic device of claim 1, wherein p-type dopants of the second gallium nitride layer and the third gallium nitride layer include magnesium (Mg).

16. The electronic device of claim 8, wherein p-type dopants of the second gallium nitride layer and the third gallium nitride layer include magnesium (Mg).

17. The electronic device of claim 1, wherein the buffer structure includes:

a first sublayer of a first thickness and a first aluminum concentration;

a second sublayer of a second thickness and a second aluminum concentration contacting and overlaying the first sublayer, wherein the second thickness is greater than the first thickness, and wherein the second aluminum concentration is less than the first aluminum concentration; and a third sublayer of a third thickness and a third aluminum concentration contacting and overlaying the second sublayer, wherein the third thickness is greater than the second thickness, and wherein the third aluminum concentration is less than the second aluminum concentration.

18. The electronic device of claim 1, wherein:

a bottom surface of the drain contact is disposed within the aluminum gallium nitride layer; and a bottom surface of the source contact is disposed within the aluminum gallium nitride layer.

19. The electronic device of claim 8, wherein the buffer structure includes:

a first sublayer of a first thickness and a first aluminum concentration;

a second sublayer of a second thickness and a second aluminum concentration contacting and overlaying the first sublayer, wherein the second thickness is greater than the first thickness, and wherein the second aluminum concentration is less than the first aluminum concentration; and a third sublayer of a third thickness and a third aluminum concentration contacting and overlaying the second sublayer, wherein the third thickness is greater than the second thickness, and wherein the third aluminum concentration is less than the second aluminum concentration.

20. The electronic device of claim 8, wherein:

a bottom surface of the drain contact is disposed within the aluminum gallium nitride layer; and a bottom surface of the source contact is disposed within the aluminum gallium nitride layer.

* * * * *